United States Patent
Poppa

(10) Patent No.: US 7,277,623 B2
(45) Date of Patent: Oct. 2, 2007

(54) EQUAL DUTY CYCLE FREQUENCY DIVIDER

(75) Inventor: Heinz Poppa, Rebhalde (AT)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 11/491,684

(22) Filed: Jul. 24, 2006

(65) Prior Publication Data
US 2007/0037527 A1   Feb. 15, 2007

Related U.S. Application Data

(60) Provisional application No. 60/702,294, filed on Jul. 26, 2005.

(30) Foreign Application Priority Data
Jul. 25, 2005   (EP)   ................... 05106809

(51) Int. Cl.
*H04N 5/95*   (2006.01)
*H04B 1/26*   (2006.01)
(52) U.S. Cl. .................................. 386/85; 455/313
(58) Field of Classification Search ................ 386/33, 386/46, 1, 92; 455/339, 313, 323, 324; 348/735
See application file for complete search history.

(56) References Cited

U.S. PATENT DOCUMENTS 6,445,726 B1 *   9/2002   Gharpurey .................. 375/136
6,643,502 B1 *   11/2003   Van De Plassche et al.   455/339

* cited by examiner

*Primary Examiner*—Robert Chevalier
(74) *Attorney, Agent, or Firm*—Tarolli, Sundheim, Covell & Tummino LLP

(57) ABSTRACT

The invention relates to a frequency divider (1), in particular for radio frequency (RF) applications, wherein the division ratio can be expressed by a—preferably odd numbered integer—divisor. The frequency divider (1) comprises an input circuit (10), which receives an input signal (5) as well as a first output signal (25). The input circuit (10) generates an intermediate signal (15), which has at least one main spectral component whose frequency corresponds to the sum or the difference of frequencies of said main spectral components of said input (5) and first output signal (25). Further, the frequency divider (1) of the invention has an output circuit (20), which receives said intermediate signal (15) and generates said first output signal (25). The main spectral component of said first output signal (25) has a frequency corresponding to the frequency of the main spectral component of said intermediate signal (15) divided by a—preferably even numbered integer. Particularly preferred this even number integer is 4.

18 Claims, 2 Drawing Sheets

EQUAL DUTY CYCLE FREQUENCY DIVIDER

RELATED APPLICATIONS

This application claims the benefit of European Patent Application No. 05 106 809.6, filed Jul. 25, 2005 and U.S. Provisional Patent Application, Ser. No. 60/702,294, filed Jul. 26, 2005.

The present invention relates to a frequency divider, in particular to a frequency divider for radio frequency (RF) applications.

In wireless communication systems, the so-called local oscillator (LO) signal is used to down convert the received signal so that the down converted signal can be demodulated and further processed at an intermediate frequency (IF) or directly in the baseband, when the frequency of the LO signal corresponds to the transmission frequency of the wireless signal path.

In the transmit direction, the LO signal is used to up convert the modulated baseband signal to the transmission frequency.

Higher integration of the circuit components, in particular for wireless communication systems, leads to the problem that the LO signal interacts with and corrupts the received signals or the RF signals to be transmitted.

Especially in direct conversion (homodyne) RF receivers, where the received RF signal is directly converted to the baseband, which implies that the frequency of the LO signal is substantially equal to the main spectral component of the received RF signal, interactions between these signals, due to a coupling of the LO signal to the received RF signal, can cause direct current (DC) offsets corrupting the data in modulation schemes, which contain information at DC.

This phenomenon can be avoided by using a frequency divider to divide the frequency of the LO signal by an odd number, preferably by 3, and then to double or quadruple the frequency of the resulting signal. This way it is ensured that neither the frequency of the LO signal nor any of its harmonics correspond to the frequency of the received RF signal.

In digital 1:3 frequency dividers according to the state-of-the-art, the output signal of the frequency divider theoretically has a duty cycle of $66,\overline{6}\%$: $33,\overline{3}\%$. This results in a 6 dB difference between the level of the main spectral component of the frequency divider's output signal and its first harmonic.

Furthermore, due to the unequal duty cycle, the output signal of the frequency divider has less power than in the case of a 50%:50% duty cycle. Particularly for switchable frequency dividers as needed in many applications, this results in different output signal levels for each division ratio.

Complex circuits to realize frequency dividers, particularly with odd numbered division ratio and equal duty cycle, are known from the state-of-the-art. However, due to their higher complexity resulting in increased signal propagation delays, these circuits are typically very limited with regard to the maximum frequency of the input signal, which they are able to divide.

In digital odd numbered frequency divider solutions and especially in integrated solutions, the necessary feedback of the flip-flop output signals via logic gates significantly reduces the maximum frequency of the input signal, which can be divided correctly. Although high maximum frequencies of the input signal can be realized with modern and fast logic gates, such logic gates require high supply currents and, therefore, produce high power dissipation. Besides said high power consumption, high-speed digital frequency dividers are typically expensive.

Thus, it is an object of the present invention to provide an improved frequency divider, in particular for radio frequency (RF) applications, wherein the division ratio can be expressed by an—preferably odd numbered—integer divisor.

It is another object of the present invention to provide a frequency divider with reduced power consumption, if compared to solutions known from the state-of-the-art.

It is yet another object of the present invention to provide a frequency divider, in particular with a division ratio having an odd numbered integer divisor, which has a substantially equal duty cycle output signal.

It is further an object of the present invention to provide a method for dividing a frequency of a main spectral component of an input signal, in particular an RF signal, wherein the division ratio can be expressed by an—preferably odd numbered—integer divisor.

According to the present invention, a frequency divider, particularly for RF applications, wherein the division ratio can be expressed by an—preferably odd numbered—integer divisor, comprises an input circuit, which receives an input signal as well as a first output signal. The input circuit generates an intermediate signal, which has at least one main spectral component, whose frequency corresponds to the sum or the difference of frequencies of said main spectral components of said input and first output signal.

Furthermore, the frequency divider according to the present invention has an output circuit, which receives said intermediate signal and generates said first output signal. The main spectral component of said first output signal has a frequency corresponding to the frequency of the main spectral component of said intermediate signal divided by a—preferably even numbered—integer. Particularly preferred, this even numbered integer is 4.

The use of standard components as output circuits in the present invention—such output circuits inherently having substantially equal duty cycles (e.g. [switchable] binary frequency dividers)—has a number of advantages compared to known equal duty cycle frequency dividers, whose division ratios can preferably be expressed by a odd numbered integer divisor.

Firstly, frequency dividers according to the present invention do not require high performance components or additional circuitry to regain an equal output duty cycle. Quite to the contrary, frequency dividers according to the present invention permit the use of low power and low cost circuits or components. Particularly in embodiments using discrete components, standard components, which are readily available, can be used.

Secondly, the lower complexity of frequency dividers according to the present invention results in decreased signal propagation delays, resulting in the ability to process higher maximum input signal frequencies, if compared to state-of-the-art devices with similar power consumption.

In a preferred embodiment of the frequency divider according to the invention, the duty cycle of said first output signal is in the interval of 40-60%, preferably in the interval of 45-55%, and most preferably in the interval of 48%-52%.

Preferably, the difference between the signal level of said main spectral component of said first output signal and the spurious first harmonic of said main spectral component of said first output signal is greater than 6 dB, more preferably greater than 10 dB, and most preferably greater than 15 dB.

In another preferred embodiment of the frequency divider according to the invention, said input circuit generates said intermediate signal, having at least two spectral components, whose frequencies correspond to the sum as well as the difference of the frequencies of said main spectral components of said input and first output signal, wherein said spectral component of said intermediate signal, whose frequency corresponds to the difference of frequencies of said main spectral components of said input and first output signal is substantially removed by a filter—preferably a high-pass filter—before the intermediate signal is fed to said output circuit.

In yet another preferred embodiment of the frequency divider according to the invention, said input circuit generates said intermediate signal, having at least two spectral components, whose frequencies correspond to the sum as well as the difference of the frequencies of said main spectral components of said output and input signal, wherein said spectral component of said intermediate signal, whose frequency corresponds to the sum of frequencies of said main spectral components of said output and input signal is substantially removed by a filter—preferably a low-pass filter—before the intermediate signal is fed to said output circuit. Preferably, in such embodiments the division ratio equals 1:5.

Preferably, in a frequency divider according to the invention, said input circuit is a mixer or an exclusive OR gate (XOR-gate).

In a particularly preferred embodiment of the frequency divider according to the invention, the division ratio is 1:3.

In yet another preferred embodiment of the frequency divider according to the invention, said output circuit is a frequency divider, preferably having a division ratio selected from a group comprising 1:2, 1:4, 1:8, 1:16, 1:32 and the like. Further, said output circuit may also be a complex programmed frequency divider, for instance a 1:10 frequency divider. Particularly preferably, such embodiments are used with an XOR-gate as an input circuit to realize frequency dividers with substantially equal duty cycles, whose division ratios depend upon the chosen type of intermediate signal filter. As will be shown below, in an embodiment having a 1:4 frequency divider as an output circuit, a suitably chosen high-pass filter leads to an overall division ratio of 1:3 and a suitably chosen low-pass filter leads to an overall division ratio of 1:5.

Accordingly, with an XOR-gate as an input circuit and a 1:2 frequency divider as an output circuit, overall division ratios of 1:1 and 1:3 can be realized; with a 1:8 frequency divider as an output circuit, overall division ratios of 1:7 and 1:9 can be realized; with a 1:16 frequency divider as an output circuit, overall division ratios of 1:15 and 1:17 can be realized, and so on. Generally, with an XOR-gate as an input circuit and a 1:n frequency divider as an output circuit, overall division ratios of 1:(n−1) and 1:(n+1) can be realized, depending on the type of filter used for the intermediate signal. Accordingly, frequency dividers of to the present invention can be implemented to have arbitrary integer division ratios while exhibiting the advantages of lower power consumption and increased high frequency performance. It should be noted that in such embodiments, the duty cycle of the output signal depends substantially only on the duty cycle of the respective output circuits, which, particularly for binary frequency dividers having division ratios of $1:2^m$, are typically substantially equal.

In a further preferred embodiment of the frequency divider according to the invention, the divider's division ratio is switchable by processing said first output signal by at least one logic gate—preferably by an AND or OR-gate—before feeding it back to said input circuit.

In yet another preferred embodiment of the frequency divider according to the invention, said output circuit is a frequency divider, which is preferably of the low power type and most preferably performs a division by 4.

Preferably, said division ratio of said output frequency divider is switchable, wherein the division ratio is most preferably selectable from a group comprising 1:2, 1:4, 1:8, 1:16, 1:32 and the like.

In another preferred embodiment of the frequency divider according to the invention, said first output signal is further divided to result in a second output signal, preferably by another frequency divider of the low power type or by another switchable frequency divider. Preferably, the division ratio of the additional switchable frequency divider is selected from a group comprising 1:2, 1:4, 1:8, 1:16, 1:32 and the like.

In a preferred embodiment, said additional frequency divider or said additional switchable frequency divider can be powered down, when the division resulting in said second output signal is not required. In such embodiments, the output signal of the frequency divider can be selected to be said first or said second output signal. Preferably, the selection is performed using a multiplexing circuit.

The present invention also refers to a method for dividing a frequency of a main spectral component of an input signal, particularly an RF signal, wherein the division ratio can be expressed by an—preferably odd numbered—integer divisor, the method comprising the following steps:

In a first step, an intermediate signal is generated, which has at least one main spectral component and whose frequency corresponds to the sum or the difference of frequencies of the main spectral component of said input signal as well as a first output signal.

In another step, said first output signal is generated having a main spectral component, which has a frequency corresponding to the frequency of the main spectral component of said intermediate signal divided by a—preferably even numbered—integer, particularly preferred by 4.

Further, the present invention relates to the use of any of the embodiments of the frequency divider or of the method for dividing a frequency as described above in a tunable frequency conversion or frequency filtering application, preferably in a phase locked loop of a tunable local oscillator for RF receivers, and most preferably homodyne RF receivers.

Additional features and advantages of the present invention may be taken from the following detailed description of particularly preferred embodiments with reference to the drawings, in which FIG. 1a shows a schematic block diagram of an embodiment of the frequency divider according to the present invention using an exclusive OR gate as an input circuit;

Figure 1:
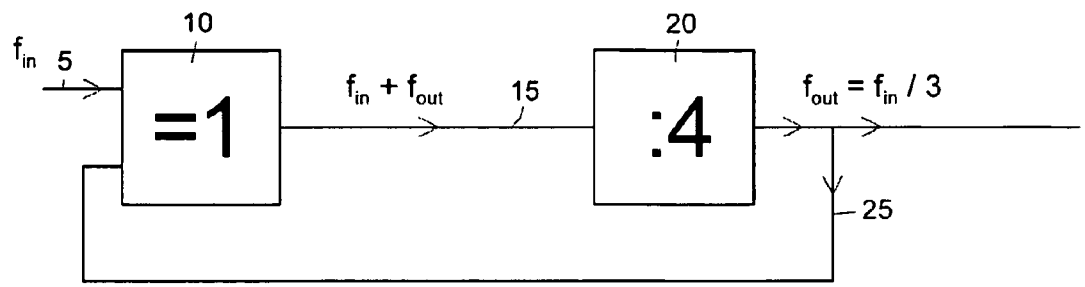

FIG. 1 shows a first embodiment of a frequency divider 1 according to the present invention. In this embodiment, the input circuit 10 is formed by an exclusive or gate (XOR-gate). The input circuit 10 receives the input signal 5, whose main spectral component has the frequency $f_{in}$. Further, the input circuit 10 receives as a second input the output signal 25 of the output circuit 20. Apart from representing the output signal of the frequency divider, this signal is at least in part fed back to the input circuit 10. Said output signal 25 has a main spectral component having a frequency $f_{out}$.

Said input circuit 10 generates an intermediate signal 15, which, due to the function of the XOR-gate, has a main spectral component, whose frequency equals $f_{in}+f_{out}$. Said intermediate signal 15 is fed to an input of said output circuit 20. In this embodiment, the output circuit 20 is formed by an inexpensive frequency divider, which performs a division by 4.

This means that the main spectral component of the output signal 25 has a frequency, which corresponds to the frequency of the main spectral component of said intermediate signal 15 divided by 4, i.e.$(f_{in}+f_{out})/4$. With the frequency of the main spectral component of the output signal 25 being defined as $f_{out}$, this leads to $(f_{in}+f_{out})/4=f_{out}$ and further to $f_{out}=f_{in}/3$. Thus, the frequency divider 1 according to the embodiment shown in FIG. 1 performs an overall division by 3.

Figure 2:
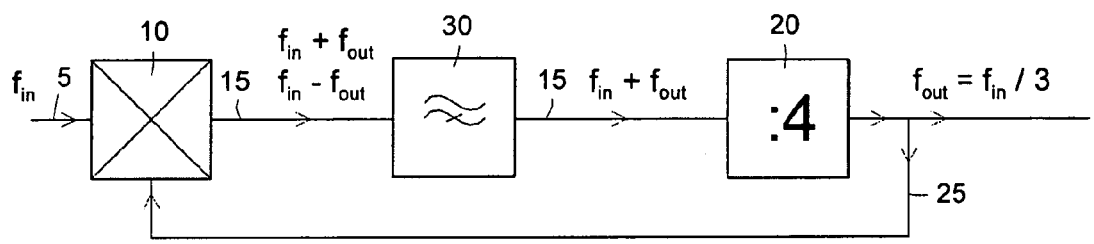
FIG. 2 shows a schematic block diagram of an embodiment of the frequency divider according to the present invention using a mixer as an input circuit.

FIG. 2 shows a frequency divider 1 according to another embodiment of the present invention. In the embodiment shown in FIG. 2, the input circuit 10 is formed by a mixer, which receives the input signal 5 having a main spectral component of the frequency $f_{in}$. Further the output signal 25 of the output circuit 20 is fed back as another input signal to the input circuit 10. Again, the output signal 25 has a main spectral component having a frequency $f_{out}$.

According to the functionality as a mixer, the input circuit 10 generates an intermediate signal 15 having two main spectral components, whose frequencies are $f_{in}+f_{out}$ and $f_{in}-f_{out}$. Said intermediate signal 15 is filtered by the high-pass filter 30 such that the main spectral component of the intermediate signal 15 whose frequency corresponds to the difference $f_{in}-f_{out}$, is substantially removed. Therefore, the intermediate signal 15 being fed to the output circuit 20 has only one main spectral component, whose frequency is $f_{in}+f_{out}$.

In the embodiment of FIG. 2, said output circuit 20 is a standard inexpensive frequency divider circuit, which performs a division by 4. With the frequency of the main spectral component of the output signal 25 being defined as $f_{out}$, this leads to $(f_{in}+f_{out})/4=f_{out}$ and further to $f_{out}=f_{in}/3$. Thus, also the frequency divider 1 according to the embodiment of FIG. 2 performs an overall division by 3.

Figure 3:
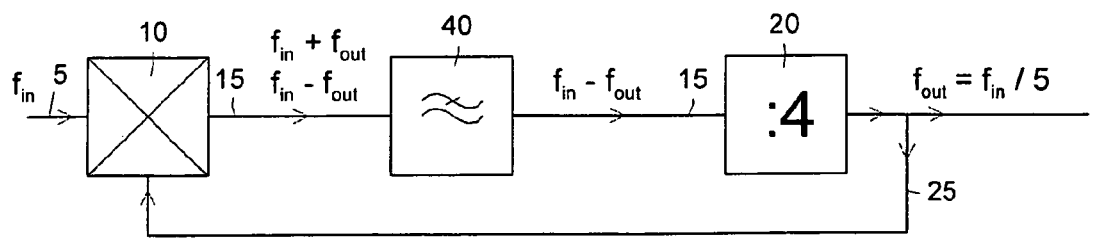
FIG. 3 shows a schematic block diagram of another embodiment of the frequency divider according to the present invention, using a mixer as an input circuit.

FIG. 3 shows yet another embodiment of a frequency divider 1 according to the present invention. The single structural difference with respect to the embodiment shown in FIG. 2 is that, instead of the high-pass filter 30, a low-pass filter 40 is used to filter the intermediate signal 15. The cut-off frequency of the low-pass filter 40 is chosen so that the main spectral component of the intermediate signal 15 whose frequency corresponds to $f_{in}+f_{out}$, is substantially removed. Thus, the intermediate signal 15 being fed to the output circuit 20 has only one main spectral component, whose frequency is $f_{in}-f_{out}$.

Likewise, in the embodiment of FIG. 3, said output circuit 20 is a standard inexpensive frequency divider circuit, which performs a division by 4. With the frequency of the main spectral component of the output signal 25 being defined as $f_{out}$, this leads to $(f_{in}-f_{out})/4=f_{out}$ and further to $f_{out}=f_{in}/5$ This means that the frequency divider 1 according to the embodiment of FIG. 3 performs an overall division by 5.

Figure 4:
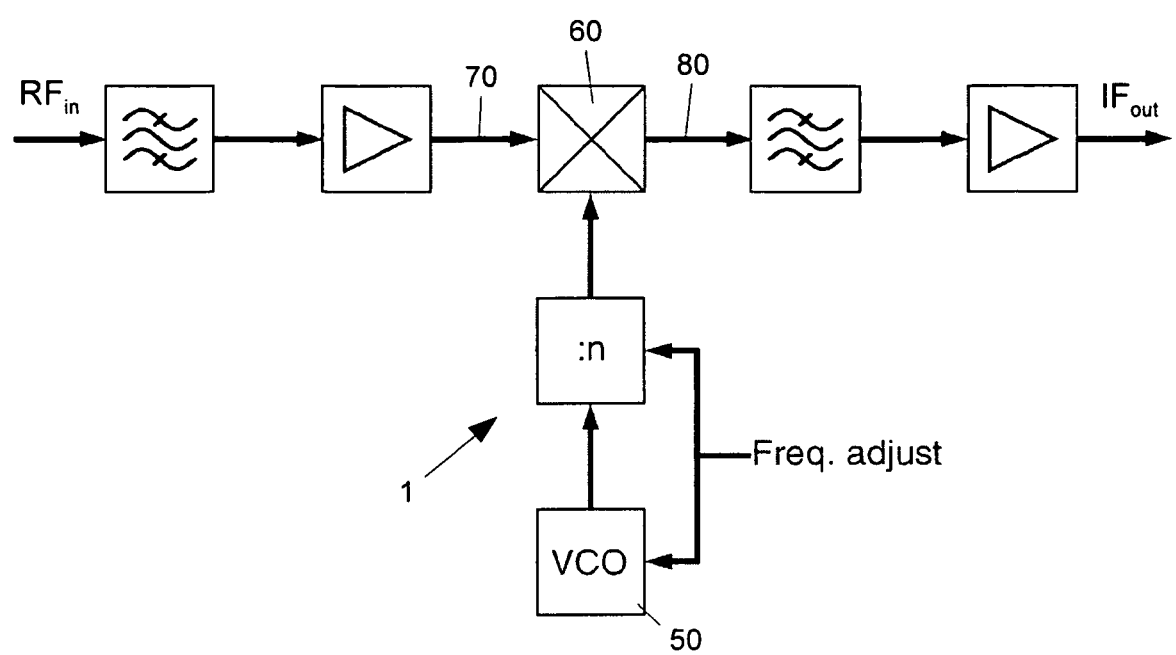
FIG. 4 shows a schematic block diagram of an RF-to-IF converter application, in which an embodiment of the frequency divider according to the present invention is used.

FIG. 4 shows an application for a frequency divider 1 according to the present invention in a tuneable RF-to-IF-converter, particularly for use in RF receivers. In this application, the frequency divider 1 is configurable to perform a division by n of the frequency of the main spectral component of the filtered output signal of a voltage controlled oscillator 50 (VCO), the VCO preferably having a tuning range between 1,5 GHz-2,0 GHz. In this application, n can be selected from a group comprising 2, 3, 4, 6 and 8. The switchable frequency divider 1 as used in the application of FIG. 4 and particularly its division ratio can be controlled by a frequency adjust signal (Freq. adjust).

The output signal of the frequency divider 1 is amplified to form the LO signal for a mixer 60, which converts a pre-processed RF input signal 70 to a lower IF signal 80 for further processing. By using a configurable frequency divider 1, the RF receiver—in the application shown in FIG. 4—can be used for receiving RF signals in different frequency bands. For each receiver frequency band, n can be chosen such that the pre-processed RF input signal 70 is converted to substantially the same IF signal frequency.

In such applications, the additionally provided division ratios of 1:3 and 1:6 of the configurable frequency divider 1 has important advantages, if compared with a simple binary programmable frequency divider, having only division ratios of 1:2, 1:4, 1:8. Where, for the simple binary programmable frequency divider, the tuning range of the VCO needs to by a full octave to cover several receiver frequency bands without a gap, with a configurable frequency divider 1 according to the invention having division ratios of 1:2, 1:3, 1:4, 1:6 and 1:8, a semi-octave tuning range of the VCO is sufficient. Such a semi-octave VCO is generally easier to manufacture and typically has significantly improved phase noise performance.

The invention claimed is:

1. Frequency divider, particularly for radio frequency (RF) applications, wherein the division ratio of said frequency diver can be expressed by an integer divisor, preferably an odd numbered integer divisor, the frequency divider comprising:

an input circuit which receives an input signal as well as a first output signal and generates an intermediate signal, the intermediate signal having at least one main spectral component, whose frequency corresponds to the sum or the difference of the frequencies of said main spectral components of said input signal and said first output signal, an output circuit, which receives said intermediate signal and generates said first output signal whose main spectral component has a frequency corresponding to the frequency of the main spectral component of said intermediate signal divided by an integer, preferably an even numbered integer, and particularly preferably by 4.

2. Frequency divider according to claim 1, wherein the duty cycle of said first output signal is in the interval of 40-60%, preferably in the interval of 45-55%, and most preferably in the interval of 48%-52%.

3. Frequency divider according to claim 1, wherein the difference between the signal level of said main spectral component of said first output signal and the spurious first harmonic of said main spectral component of said first output signal is greater than 6 dB, more preferably greater than 10 dB and most preferably greater than 15 dB.

4. Frequency divider according to claim 1, wherein said input circuit generates said intermediate signal having at least two spectral components, whose frequencies correspond to the sum and the difference of frequencies of said main spectral components of said input signal and said first output signal, wherein said spectral component of said intermediate signal, whose frequency corresponds to said difference of frequencies, is substantially removed by a filter, preferably high-pass filter before said intermediate signal is fed to said output circuit.

5. Frequency divider according to claim 1, wherein said input circuit generates said intermediate signal having at least two spectral components, whose frequencies correspond to the sum and the difference of frequencies of said main spectral components of said input signal and said first output signal wherein said spectral component of said intermediate signal, whose frequency corresponds to said sum of frequencies, is substantially removed by a filter, preferably low-pass filter, before said intermediate signal is fed to said output circuit.

6. Frequency divider according to claim 4, wherein said input circuit is a mixer.

7. Frequency divider according to claim 5, wherein the overall division ratio is 1:5.

8. Frequency divider according to claim 1, wherein said input circuit is an exclusive OR-gate (XOR-gate).

9. Frequency divider according to claim 4, wherein the overall division ratio is 1:3.

10. Frequency divider according to claim 8, wherein said output circuit is a frequency divider, whose division ratio is preferably selected from a group comprising 1:2, 1:4, 1:8, 1:16, and 1:32.

11. Frequency divider according to claim 8 wherein the overall division ratio is switchable by processing said first output signal by at least one logic gate, preferably by an AND- or OR-gate, before feeding it to said input circuit.

12. Frequency divider according to claim 1, wherein said output circuit is a frequency divider, which is preferably of the low power type and most preferably performs a division by 4.

13. Frequency divider according to claim 1, wherein said output circuit is a frequency divider whose division ratio is switchable, wherein the division ratio of said output circuit is preferably selected from a group comprising 1:2, 1:4, 1:8, 1:16and 1:32.

14. Frequency divider according to claim 1 wherein said first output signal is further divided to result in a second output signal, preferably by another frequency divider of the low power type or by another switchable frequency divider, whose division ratio is preferably selected from a group comprising 1:2, 1:4, 1:8, 1:16 and 1:32.

15. Frequency divider according to claim 14, wherein said additional frequency divider or said additional switchable frequency divider can be powered down when the division resulting in said second output signal is not required.

16. Frequency divider according to claim 14, wherein an overall output signal of the frequency divider is selectable to be said first output signal or said second output signal, wherein selection is preferably done by a multiplexing circuit.

17. Method for dividing a frequency of a main spectral component of an input signal, particularly an RF signal, wherein the division ratio can be expressed by an integer divisor, preferably an odd numbered integer divisor, the method comprising the following steps:

generating an intermediate signal having at least one main spectral component, whose frequency corresponds to the sum or the difference of the frequencies of the main spectral components of said input signal and a first output signal, generating said first output signal with a main spectral component having a frequency corresponding to the frequency of the main spectral component of said intermediate signal divided by an integer, preferably an even numbered integer, and particularly preferred by 4.

18. Use of a frequency divider according to claim 1 in a tunable frequency conversion or filtering application, preferably in a phase locked loop of a tunable local oscillator for RF receivers, and most preferably for homodyne RF receivers.

* * * * *